United States Patent
Yamamoto et al.

(10) Patent No.: US 7,898,161 B2
(45) Date of Patent: Mar. 1, 2011

(54) DIAMOND ELECTRON RADIATION CATHODE, ELECTRON SOURCE, ELECTRON MICROSCOPE, AND ELECTRON BEAM EXPOSER

(75) Inventors: Yoshiyuki Yamamoto, Itami (JP); Akihiko Ueda, Itami (JP); Yoshiki Nishibayashi, Itami (JP); Takahiro Imai, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 336 days.

(21) Appl. No.: 12/095,430

(22) PCT Filed: Jun. 27, 2007

(86) PCT No.: PCT/JP2007/062885
§ 371 (c)(1),
(2), (4) Date: May 29, 2008

(87) PCT Pub. No.: WO2008/001805
PCT Pub. Date: Jan. 3, 2008

(65) Prior Publication Data
US 2009/0160308 A1  Jun. 25, 2009

(30) Foreign Application Priority Data
Jun. 28, 2006  (JP) ................... 2006-178250

(51) Int. Cl.
*H01J 1/02*  (2006.01)
(52) U.S. Cl. ......... 313/309; 313/310; 313/311; 313/341; 313/336
(58) Field of Classification Search .......... 313/336, 313/310, 341, 309, 311
See application file for complete search history.

(56) References Cited

U.S. PATENT DOCUMENTS

| | | | |
|---|---|---|---|
| 5,010,249 A | 4/1991 | Nishikawa | |
| 5,283,501 A | 2/1994 | Zhu et al. | |
| 5,289,086 A | 2/1994 | Kane | |
| 5,844,251 A * | 12/1998 | MacDonald et al. | 257/10 |
| 6,762,543 B1 * | 7/2004 | Kang et al. | 313/311 |
| 7,026,750 B2 * | 4/2006 | Nishibayashi et al. | 313/346 R |

(Continued)

FOREIGN PATENT DOCUMENTS

EP  0794406 A1  9/1997

(Continued)

OTHER PUBLICATIONS

Machine Translation of WO2006-135092.*

(Continued)

*Primary Examiner* — Nimeshkumar D Patel
*Assistant Examiner* — Jacob Stern
(74) *Attorney, Agent, or Firm* — Osha Liang LLP

(57) ABSTRACT

An object is to provide an electron emitting cathode achieving high luminance, low energy dispersion, and long life. It is therefore an object to provide a diamond electron emitting cathode graspable on a sufficiently stable basis, sharpened at the tip, and improved in electric field intensity. A diamond electron emitting cathode 110 according to the present invention is partitioned into at least three regions, i.e., a front end region 203 intended for electron emission at a tip of columnar shape, a rear end region 201 intended for grasping opposite in the longitudinal direction, and a thinned intermediate region 202, a cross-sectional area of the rear end region is not less than 0.2 mm², the tip of the front end region is sharpened, and a maximum cross-sectional area of the thinned intermediate region is not more than 0.1 mm².

18 Claims, 5 Drawing Sheets

U.S. PATENT DOCUMENTS

| | | | |
|---|---|---|---|
| 2002/0031913 A1 | 3/2002 | Nishibayashi et al. | |
| 2006/0244352 A1* | 11/2006 | Tatsumi et al. | 313/311 |

FOREIGN PATENT DOCUMENTS

| | | |
|---|---|---|
| EP | 1184885 A1 | 3/2002 |
| EP | 1401006 A2 | 3/2004 |
| EP | 1746622 A1 | 1/2007 |
| EP | 1892740 A1 | 2/2008 |
| JP | 62-140332 | 6/1987 |
| JP | 4-67527 | 3/1992 |
| JP | 9-297148 | 11/1997 |
| JP | 2002-75171 | 3/2002 |
| JP | 2004-243490 | 9/2004 |
| JP | 2005-190758 | 7/2005 |
| JP | 2005-310450 | 11/2005 |
| JP | 2007-149659 | 6/2007 |
| WO | 2006/135092 | 12/2006 |

OTHER PUBLICATIONS

Chinese Office Action for Chinese Application No. 2007800037057, mailed on Aug. 21, 2009 (21 pages).

Translation of the International Preliminary Report on Patentability mailed Jan. 29, 2009, 9 pages.

International Search Report (English only) for PCT/JP2007/062885 mailed Aug. 28, 2007 (3 pages).

esp@cenet Patent Abstract JP4067527 dated Mar. 3, 1992 (1 page).

"Quantum photoyield of diamond (111)—A stable negative-affinity emitter" Physical Review B, vol. 20, No. 2; Jul. 15, 1979 Author(s): Himpsel et al. pp. 624-627.

"The Role of Adsorbates and Defects on Diamond Surfaces" New Diamond and Frontier Carbon Technology, vol. 10, No. 6; Jul. 21, 2000, Authors(s): Ristein et al. pp. 363-382.

"Development of 'Diamond Nano-Emitters'" SEI Technical Review, No. 57, Jan. 2004 Authors(s): Nishbayashi et al. pp. 31-36.

"Field emission from diamond coated molybdenum field emitters" J. Vac. Sci. Technol. B 14(3), May/Jun. 1996, Author(s): choi et al. pp. 2050-2055.

esp@cenet Patent Abstract JP2007149659 dated Jun. 14, 2007 (1 page).

esp@cenet Patent Abstract JP2005190758 dated Jul. 14, 2005 (1 page).

esp@cenet Patent Abstract JP2002075171 dated Mar. 15, 2002 (1 page).

esp@cenet Patent Abstract JP2005310450 dated Nov. 4, 2005 (1 page).

esp@cenet Patent Abstract JP62140332 dated Jun. 23, 1987 (1 page).

esp@cenet Patent Abstract JP2004243490 dated Sep. 2, 2004 (1 page).

esp@cenet Patent Abstract JP9297148 dated Nov. 18, 1997 (1 page).

Extended European Search Report in EP Application No. 07767687.2-2208/2034504, dated Jul. 16, 2010 (26 pages).

"Beam-assisted-etching technique for fabrication of single crystal diamond field emitter tip", Taniguchi et al., Microelectronic Engineering, Elsevier Publishers BV., Amsterdam, NL, vol. 53, No. 1-4, ISSN: 0167-9317, Jun. 1, 2000, p. 415-p. 418, XP022553213.

"Anisotropic etching of a fine column on a single crystal diamond", Nishibayashi Y et al., Diamond and Related Materials, Elsevier Science Publishers, Amsterdam, NL LNKD-DOI:10.1016/S0925-9635(01)00404-6, vol. 10, No. 9-10, ISSN: 0925-9635, Sep. 1, 2001, p. 1732-p. 1735, XP004321113.

"Secondary electron emission characteristics of single-crystal and polycrystalline diamond", Yater J E et al., Journal of Applied Physics, American Institute of Physics. New York, US LNKD-DOI:10.1063/1.373505, vol. 87, No. 11, ISSN: 0021-8979, Jun. 1, 2000, p. 8103-p. 8112, XP012049209.

* cited by examiner

DIAMOND ELECTRON RADIATION CATHODE, ELECTRON SOURCE, ELECTRON MICROSCOPE, AND ELECTRON BEAM EXPOSER

TECHNICAL FIELD

The present invention relates to a field emission type diamond electron emitting cathode used, for example, in electron radiation and electron beam equipment such as electron microscopes and electron beam lithography system. The invention also relates to an electron source with the diamond electron emitting cathode and electronic equipment using them.

BACKGROUND ART

An electron has a minus charge and an extremely small mass, and therefore an electron beam as a stream of electrons aligned in one direction has the following features. (1) The direction and convergence can be controlled by an electric field or a magnetic field. (2) A wide range of energy is obtained by acceleration/deceleration with an electric field. (3) The wavelength is short and the beam can be narrowed to a fine size. The electron microscopes and electron beam lithography system making use of such features are widely used. Cathode materials of these devices include, for example, an inexpensive W filament as a thermion emission source, and hexaborides such as $LaB_6$ capable of achieving an electron beam with high luminance.

The cathodes for higher luminance and a narrower energy width in use include peaked W making use of tunneling by the quantum effect, and ZrO/W making use of the Schottky effect by the electric field.

Since there are demands for high-accuracy observation of a smaller object with the electron microscopes and progress in development of 65 nm and finer node technologies with the electron beam lithography system, there are expectations for a cathode capable of achieving much higher luminance and a much narrower energy width.

Diamond is one of materials meeting such expectations. Diamond can take a state of negative electron affinity (NEA) or a state of positive electron affinity (PEA) smaller than that of metal with a small work function as described in Non-patent Document 1 or Non-patent Document 2. By making use of this extremely rare property, electrons can be emitted in high current density, without need for high temperatures over 1000° C. as in the case of the W filament, $LaB_6$, or ZrO/W, and the energy width can be controlled in a narrow range. Since the drive temperature is low, a long life is expected. Since there is the microfabrication technology to obtain the tip diameter of 10 nm as in Non-patent Document 3, there is no problem in terms of increase in luminance. The electron sources as described in Non-patent Document 4 and Patent Document 1 have been proposed heretofore since it was found that diamond had the electron affinity as described above.

There are various forms of electron guns depending upon mechanisms of electron emission, such as the thermionic emission type and the field emission type, but all of them have a structure in which an electric field is applied to an electron emitting cathode to emit electrons and the electrons are extracted. Since the electric field is more concentrated under the same voltage when applied to a shape with a pointed end than when applied to a planar shape, a sharp-pointed shape is often used for the electron emission materials used in the electron guns.

Peaked W to extract electrons at room temperature by making use of tunneling by the quantum effect is called a field emission type electron gun. An electron emission source (emitter) is a chip with a pointed end having the length of a little less than 2 mm and consisting mainly of a single crystal of W (111), W (310), or W (100) orientation, and it is used as attached to a W filament. An extraction electrode paired with this emitter is located at a distance of about several mm from the emitter. These emitter and extraction electrode are brought into a high vacuum state.

The field emission type electron gun using this peaked W has such features as an overwhelmingly smaller energy width of electrons and higher luminance than the other thermion sources and the like. Since it achieves the energy width of about 200-300 meV and reduces chromatic aberration of lenses used in an electron optical system, it is greatly useful for improvement in the performance of the electron microscope. However, it has to be used in ultrahigh vacuum of approximately $10^{-8}$ Pa, and it was essential to perform a cleaning work (thermal flash) of instantaneously energizing and heating the emitter on a regular basis to remove gas molecules adsorbed to the emitter.

The electron guns using diamond are expected to achieve higher luminance, lower energy dispersion, and longer life than the conventional electron guns, but there was a below-described problem in its grasping method, particularly, where it is used as a thermal field emission type or field emission type electron gun.

Namely, for example, in the case of the thermal field emission type electron gun using $LaB_6$ as an electron emission material, it has a form in which a chip of $LaB_6$ with a pointed tip is pinched by metal or the like to be grasped, but this method necessitates some thickness of a region to be grasped. Specifically, if the cross-sectional area is less than $0.1\ mm^2$, it becomes difficult to grasp the chip. Therefore, the region to be grasped needs to have the size of not less than $0.1\ mm^2$ as a cross-sectional area, but if the chip is processed to be sharpened from the grasped region toward the electron emission part it will be difficult to implement further sharpening of the tip. It also becomes necessary to increase the diameter of a hole of a suppressor part, and this adversely affects improvement in extraction efficiency.

On the other hand, in the case of a W electrode used in ZrO/W or a cold cathode, a W chip with a pointed tip is grasped as welded to a W wire. This method allows use of an electron emitting cathode sufficiently sharpened, but in the case where diamond is applied to the electron emitting cathode, there is a problem that it is very difficult to implement welding thereof to a metal wire.

Patent Document 1: Japanese Patent Application Laid-open No. 4-67527

Non-patent Document 1: F. J. Himpsel et al., Phys. Rev. B., Vol. 20, Number 2 (1979) 624

Non-patent Document 2: J. Ristein et al., New Diamond and Frontier Carbon Technology, Vol. 10, No. 6, (2000) 363

Non-patent Document 3: Y. Nishibayashi et al., SEI Technical Review, 57, (2004) 31

Non-patent Document 4: W. B. Choi et al., J. Vac. Sci. Technol. B 14, (1996) 2051

DISCLOSURE OF THE INVENTION

Problem to be Solved by the Invention

It is therefore an object of the present invention to provide an electron emitting cathode made of diamond, so as to provide an electron emitting cathode achieving high luminance, low energy dispersion, and long life. In this regard, it is an object of the present invention to provide a diamond electron emitting cathode graspable on a sufficiently stable basis, sharpened at its tip, and improved in electric field strength.

Means for Solving the Problem

The inventors conducted elaborate research for realizing a grasping method in use of diamond as an electron emitting cathode, sharpening of the tip, and improvement in electric field strength at the tip all together, and accomplished the present invention.

Namely, the present invention is as described below.

1) The present invention provides a columnar diamond electron emitting cathode having a single crystal diamond in at least a part thereof, the columnar diamond electron emitting cathode comprising at least a front end region intended for electron emission, a rear end region intended for grasping, and a thinned intermediate region located between the front end region and the rear end region, wherein a tip part of the front end region is sharpened.

2) The present invention provides the diamond electron emitting cathode according to the foregoing aspect 1), wherein a cross-sectional area of the rear end region is not less than 0.1 mm$^2$ and a cross-sectional area of the intermediate region is not more than 0.1 mm$^2$.

3) The present invention provides the diamond electron emitting cathode according to the foregoing aspect 1) or 2), wherein a longitudinal length of the rear end region is not less than 0.5 mm nor more than 2 mm and a longitudinal length of the intermediate region is not less than 0.5 mm nor more than 2 mm.

4) The present invention provides the diamond electron emitting cathode according to any one of the foregoing aspects 1) to 3), wherein the rear end region, the front end region, and the intermediate region have a common principal surface, an electroconductive layer is formed in at least a part on the common principal surface, and the electroconductive layer ensures electrical conduction between the rear end region and the front end region.

5) The present invention provides the diamond electron emitting cathode according to the foregoing aspect 4), wherein a plain orientation of the common principal surface is the (111) plane, or a plane with deviation of not more than 8° from the (111) plane.

6) The present invention provides the diamond electron emitting cathode according to the foregoing aspect 4), wherein the electroconductive layer is made of a diamond to demonstrate a n-type semiconductivity.

7) The present invention provides the diamond electron emitting cathode according to any one of the foregoing aspects 1) to 6), wherein a cross-sectional shape of the rear end region is substantially rectangular or square.

8) The present invention provides the diamond electron emitting cathode according to any one of the foregoing aspects 1) to 7), wherein a thickness of the thinned intermediate region is not less than 0.02 mm nor more than 0.15 mm.

9) The present invention provides a columnar diamond electron emitting cathode having a single crystal diamond in at least a part thereof, the columnar diamond electron emitting cathode comprising at least a front end region intended for electron emission, and a rear end region intended for grasping, wherein a tip part of the front end region is sharpened.

10) The present invention provides the diamond electron emitting cathode according to the foregoing aspect 9), wherein a cross-sectional area of the rear end region is not less than 0.1 mm$^2$, a longitudinal length of the rear end region is not less than 0.5 nor more than 2.0 mm, and a length of the front end region is not less than 1.0 nor more than 3.0 mm.

11) The present invention provides the diamond electron emitting cathode according to the foregoing aspect 9) or 10), wherein the rear end region and the front end region have a common principal surface, an electroconductive layer is formed in at least a part on the common principal surface, and the electroconductive layer ensures electrical conduction between the rear end region and the front end region.

12) The present invention provides the diamond electron emitting cathode according to the foregoing aspect 11), wherein a plain orientation of the common principal surface is the (111) plane, or a plane with deviation of not more than 8° from the (111) plane.

13) The present invention provides the diamond electron emitting cathode according to the foregoing aspect 11), wherein the electroconductive layer is made of a diamond to demonstrate a n-type semiconductivity.

14) The present invention provides the diamond electron emitting cathode according to any one of the foregoing aspects 9) to 13), wherein a cross-sectional shape of the rear end region is substantially rectangular or square.

15) The present invention provides a diamond electron source having a structure comprising at least the diamond electron emitting cathode as set forth in any one of the foregoing aspects 1) to 8), an insulating ceramic, and at least one pair of terminals for supplying an electric current to the electron emitting cathode.

16) The present invention provides the diamond electron source according to the foregoing aspect 15), which has an electroconductive member for suppressing electron emission from a region except for the front end region of the diamond electron emitting cathode, wherein the intermediate region of the diamond electron emitting cathode penetrates through a through hole formed in the electroconductive member.

17) The present invention provides a diamond electron source having a structure comprising at least the diamond electron emitting cathode as set forth in any one of the foregoing aspects 9) to 14), an insulating ceramic, and at least one pair of terminals for supplying an electric current to the electron emitting cathode.

18) The present invention provides the diamond electron source according to the foregoing aspect 17), which has an electroconductive member for suppressing electron emission from a region except for the front end region of the diamond electron emitting cathode, wherein the front end region of the diamond electron emitting cathode penetrates through a through hole formed in the electroconductive member.

19) The present invention provides an electron microscope wherein the diamond electron source as set forth in any one of the foregoing aspects 15) to 18) is mounted.

20) The present invention provides an electron beam lithography system wherein the diamond electron source as set forth in any one of the foregoing aspects 15) to 18) is mounted.

DESCRIPTION OF REFERENCE SYMBOLS

Figure 1:
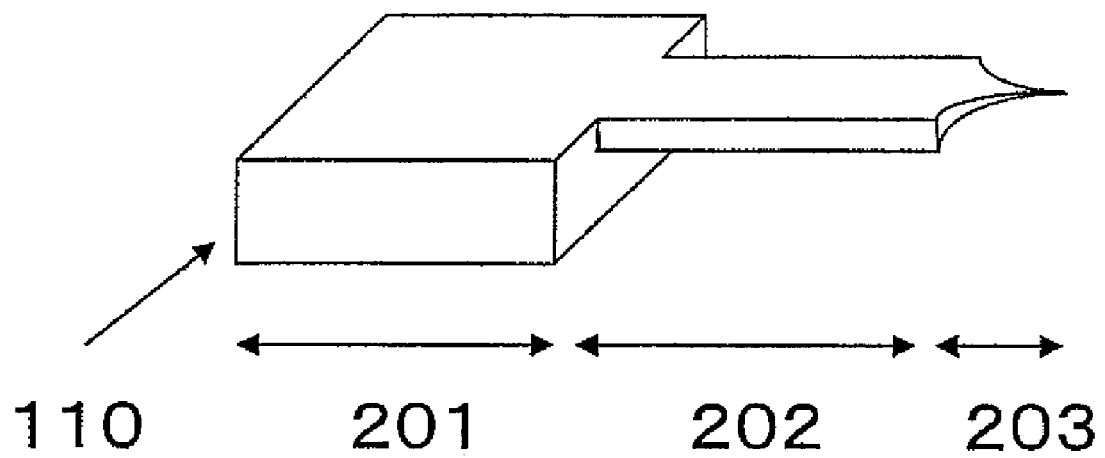
FIG. 1 is a perspective view showing an electron emitting cathode (first embodiment) according to the present invention.

101, 501 diamond single crystal
102, 502 surface of plain orientation (111)
103, 503 P-doped epitaxial diamond
104, 504 pattern of Al
110, 400 diamond electron emitting cathode
201, 401 rear end region
202 intermediate region
203, 402 front end region
301 electron gun
310 suppressor
320 terminal
330 insulating ceramic
340 metal member of inconel
350 spacer

BEST MODES FOR CARRYING OUT THE INVENTION

The first embodiment of the present invention is as described below.

As shown in FIG. 1, a diamond electron emitting cathode 110 according to the present invention is partitionable into three parts along the longitudinal direction. Namely, it is composed of a rear end region 201 intended for grasping, a thinned intermediate region 202, and a front end region 203 intended for electron emission.

The tip part of the front end region intended for electron emission is sharpened. Since the cathode has the rear end region intended for grasping, it can be readily grasped as mechanically pinched as the conventional ones are. A cross-sectional shape perpendicular to the longitudinal direction of this rear end region is preferably rectangular or square in terms of easiness of grasping.

The intermediate region is located midway between the rear end region and the front end region and is subjected to a thinning process to be thinned in a smaller size than the rear end region. The "thinning process" stated herein refers to such processing that, where the cross-sectional shape perpendicular to the longitudinal direction of the rear end region is rectangular or square, the length of at least one set of opposed sides of the rectangular or square shape is reduced by 10% or more.

The diamond electron emitting cathode according to the present embodiment may be made entirely of diamond, or in combination with a material except for diamond, but it is preferably made entirely of diamond. More preferably, at least a part of the portion made of diamond is comprised of single crystal diamond because the cathode exhibits a stable electron emission characteristic. It is particularly preferable that the front end region be made of single crystal diamond.

The thinned intermediate region is so configured that the cross-sectional area of the surface perpendicular to the longitudinal direction thereof is not more than 0.1 mm², because it is advantageous for forming the region intended for electron emission by sharpening the tip thereof Since this configuration permits the diameter of a hole of a suppressor to be defined as a necessary minimum and, in turn, permits an extraction electrode to be formed in a small size, it is effective, particularly, in the case where it is necessary to emit electrons with the help of an electric field.

On the other hand, the rear end region intended for grasping preferably has the cross-sectional area of not less than 0.1 mm² perpendicular to the longitudinal direction thereof. This makes it easier to grasp the rear end region as mechanically pinched, and ensures sufficient mechanical strength thereof, and the strength is also maintained even after long-term operation. If the length of the rear end region intended for grasping is too short, a grasping force will be too weak; if it is too long, cost will increase. For this reason, the length is preferably not less than 0.5 mm nor more than 2 mm.

Diamond is an intrinsic semiconductor and has the large bandgap of not less than 5 eV, and it is thus an insulator at room temperature. In use as an electron emitting cathode, electrical conductivity is required between the front end region intended for electron emission and the rear end region intended for grasping. In the present invention, therefore, the front end region, the rear end region, and the thinned intermediate region preferably have a common principal surface. This is because electrical conduction can be established between each of the rear end region and the front end region, and the intermediate region by forming an electroconductive layer on the principal surface of them. This can ensure electrical conduction between the rear end region and the front end region and improve the electron emission characteristic even in the case where diamond to demonstrate the characteristics of an intrinsic semiconductor without any impurity is used as a material.

The electroconductive layer is preferably made of diamond in terms of durability or the like as well. Diamond can have semiconductivity when an impurity is mixed in the lattice of diamond. For example, when B (boron) is mixed in diamond, it serves as a p-type semiconductor; when N (nitrogen) or P (phosphorus) is mixed, it serves as an n-type semiconductor. Use of an n-type semiconductor as an electron emission material is more advantageous in terms of energy. Among the n-type semiconductors, diamond doped with P has a lower activation energy and can supply a larger number of carriers (electrons) to the conduction band at lower temperature than diamond doped with N. For forming the diamond of the n-type semiconductivity doped with P, as an electroconductive layer on diamond, however, the surface on which it is formed, is preferably the (111) plane, or a plane with orientation deviation of not more than 8° from the (111) plane. Namely, the plain orientation of the common principal surface is also preferably defined in this range.

The thickness of the thinned intermediate region is preferably not less than 0.02 mm nor more than 0.15 mm. If the thickness exceeds 0.15 mm it becomes difficult to achieve satisfactory sharpening of the tip. If the thickness is smaller than 0.02 mm the mechanical strength becomes extremely low and the intermediate region can break in a grasping step or during use as a product, and it is not preferable from the aspect of durability after mounted on an electron gun. The thickness of the thinned intermediate region herein refers to the thickness in a direction of a normal to the aforementioned principal surface.

Techniques of sharpening to be used include, for example, a method by mechanical polishing, a method by combination of photolithography with etching, a method by epitaxial growth, and so on, and it is preferable to adopt the method by combination of photolithography with etching, from the viewpoint of obtaining a more sharpened tip more simply.

An electron source, which is a structural body to be mounted in an electron microscope, an electron beam lithography system, or the like, is preferably a structure composed of the diamond electron emitting cathode in the present embodiment, an insulating ceramic, and at least one pair of terminals for supplying an electric current to the diamond electron emitting cathode. In this case, the diamond electron emitting cathode according to the present invention can be attached without any special device to a power supply system in electron beam equipment where the conventional cathode materials are used.

Furthermore, when the electron emitting cathode of the present embodiment is applied as a thermal field emission type, it is necessary to use a suppressor for suppressing emission of thermions or the like from the region other than the electron emission region. It is preferable to adopt a structure in which the thinned region or the region intended for electron emission in the electron emitting cathode of the present embodiment penetrates through a hole of the suppressor. Therefore, the sum of the longitudinal length of the intermediate region and the longitudinal length of the front end region is preferably not less than the length of the hole of the suppressor. The longitudinal length of the intermediate region is preferably not less than 0.5 mm. If it is too long, cost will increase, and thus the length is preferably not more than 2 mm.

An electron microscope according to the present embodiment is characterized in that it is equipped with the diamond electron emitting cathode or the diamond electron source according to the present embodiment. Since the diamond electron emitting cathode or the diamond electron source according to the present embodiment is able to provide an electron beam in high current density, high luminance, and low energy width, the electron microscope enables observation at higher magnifications than the electron microscopes in which the conventional cathode materials are used.

An electron beam lithography system according to the present embodiment is characterized in that it is equipped with the diamond electron emitting cathode or the diamond electron source according to the present embodiment. Since the diamond electron emitting cathode or the diamond electron source according to the present invention is able to provide an electron beam in high current density, high luminance, and low energy width, the electron beam lithography system of the present embodiment is able to draw a finer pattern at high throughput than the electron beam lithography system where the conventional cathode materials are used.

The second embodiment of the present invention is as described below.

Figure 4:
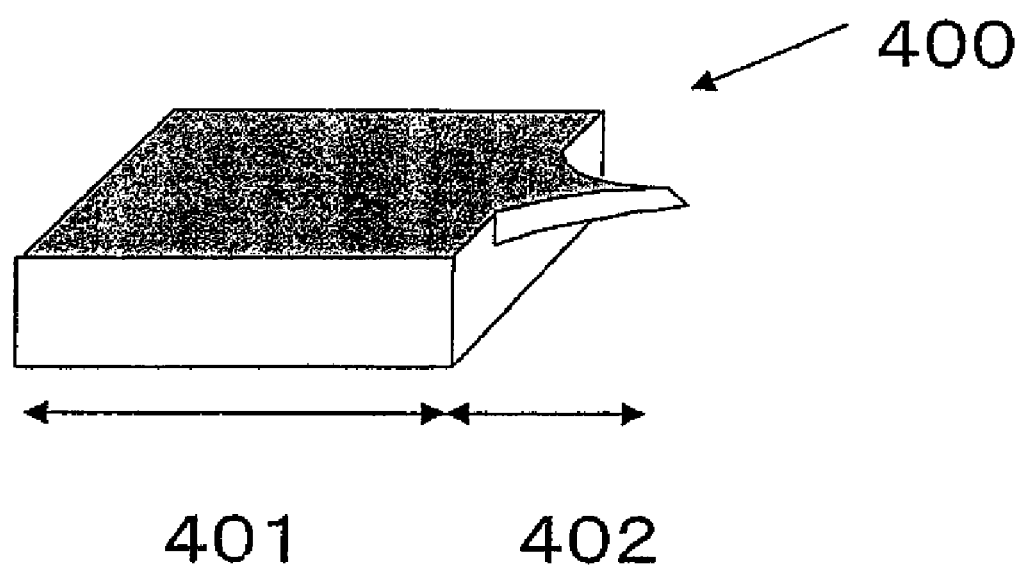
FIG. 4 is a perspective view showing an electron emitting cathode (second embodiment) according to the present invention.

As shown in FIG. 4, a diamond electron emitting cathode 400 according to this embodiment is partitionable into two parts in the longitudinal direction. Namely, it is composed of a rear end region 401 intended for grasping, and a front end region 402 intended for electron emission.

The tip part of the front end region intended for electron emission is sharpened. Since the cathode has the rear end region intended for grasping, it can be readily grasped as mechanically pinched as the conventional ones are. A cross-sectional shape perpendicular to the longitudinal direction of this rear end region is preferably rectangular or square in terms of easiness of grasping.

The diamond electron emitting cathode according to the present embodiment may be made entirely of diamond, or in combination with a material except for diamond, but it is preferably made entirely of diamond. More preferably, at least a part of the portion made of diamond is comprised of single crystal diamond because the cathode exhibits a stable electron emission characteristic. It is particularly preferable that the front end region be made of single crystal diamond.

On the other hand, the rear end region intended for grasping preferably has the cross-sectional area of not less than 0.1 mm$^2$ perpendicular to the longitudinal direction thereof. This makes it easier to grasp the rear end region as mechanically pinched, and ensures sufficient mechanical strength thereof, and the strength is also maintained even after long-term operation. If the length of the rear end region intended for grasping is too short, a grasping force will be too weak; if it is too long, cost will increase. For this reason, the length is preferably not less than 0.5 mm nor more than 2 mm.

Diamond is an intrinsic semiconductor and has the large bandgap of not less than 5 eV, and it is thus an insulator at room temperature. In use as an electron emitting cathode, electrical conductivity is required between the front end region intended for electron emission and the rear end region intended for grasping. In the present invention, therefore, the front end region and the rear end region preferably have a common principal surface. This is because electrical conduction can be established between the rear end region and the front end region by forming an electroconductive layer on the principal surface of them. This can ensure electrical conduction between the rear end region and the front end region and improve the electron emission characteristic even in the case where diamond to demonstrate the characteristics of an intrinsic semiconductor without any impurity is used as a material.

The electroconductive layer is preferably made of diamond in terms of durability or the like as well. Diamond can have semiconductivity when an impurity is mixed in the lattice of diamond. For example, when B (boron) is mixed in diamond, it serves as a p-type semiconductor; when N (nitrogen) or P (phosphorus) is mixed, it serves as an n-type semiconductor. Use of an n-type semiconductor as an electron emission material is more advantageous in terms of energy. Among the n-type semiconductors, diamond doped with P has a lower activation energy and can supply a larger number of carriers (electrons) to the conduction band at lower temperature than diamond doped with N. For forming the diamond of the n-type semiconductivity doped with P, as an electroconductive layer on diamond, however, the surface on which it is formed, is preferably the (111) plane, or a plane with orientation deviation of not more than 8° from the (111) plane. Namely, the plain orientation of the common principal surface is also preferably defined in this range.

An electron source, which is a structural body to be mounted in an electron microscope, an electron beam lithography system, or the like, is preferably a structure composed of the diamond electron emitting cathode in the present embodiment, an insulating ceramic, and at least one pair of terminals for supplying an electric current to the diamond electron emitting cathode. In this case, the diamond electron emitting cathode according to the present invention can be attached without any special device to a power supply system in electron beam equipment where the conventional cathode materials are used.

Furthermore, when the electron emitting cathode of the present embodiment is applied as a thermal field emission type, it is necessary to use a suppressor for suppressing emission of thermions or the like from the region other than the electron emission region. It is preferable to adopt a structure in which the region intended for electron emission in the electron emitting cathode of the present embodiment penetrates through a hole of the suppressor. Therefore, the longitudinal length of the tip region is preferably not less than the length of the hole of the suppressor and is preferably not less than 1 mm. If it is too long, cost will increase, and thus the length is preferably not more than 3 mm.

An electron microscope according to the present embodiment is characterized in that it is equipped with the diamond electron emitting cathode or the diamond electron source according to the present embodiment. Since the diamond electron emitting cathode or the diamond electron source according to the present embodiment is able to provide an electron beam in high current density, high luminance, and low energy width, the electron microscope enables observation at higher magnifications than the electron microscopes in which the conventional cathode materials are used.

EXAMPLES

The present invention will be described below in detail on the basis of examples.

Example 1

Figure 2:
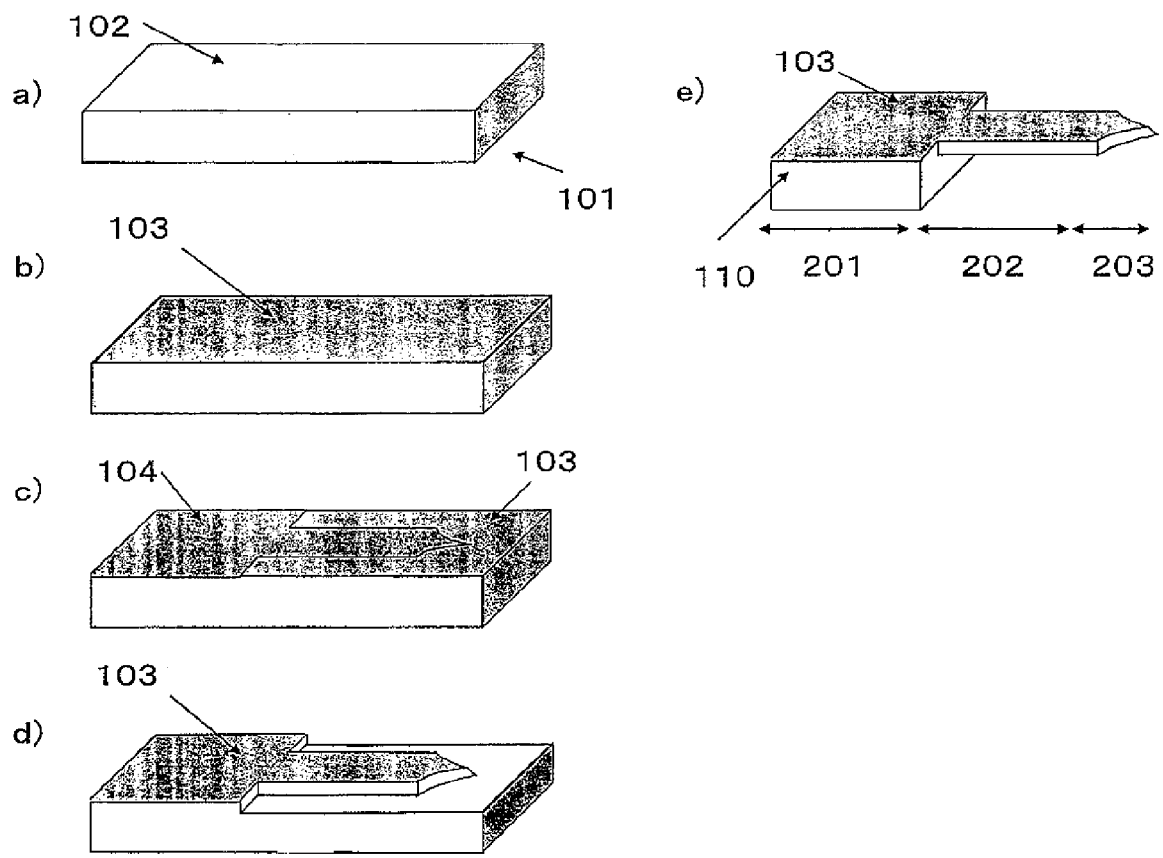
FIG. 2 is a perspective view showing a production process (first embodiment) of the electron emitting cathode according to an example.

Single crystal diamonds A-D obtained by a high-temperature high-pressure synthesis method were prepared as shown in FIG. 2 a). Another single crystal diamond E homoepitaxially grown similarly by a chemical vapor deposition (CVD) growth technique was also prepared. Concerning the plain orientation, a surface denoted by 102 in the drawing was the (111) plane (with deviation of plain orientation of 3-5°). As shown in FIG. 2 b), a P-doped epitaxial diamond 103 was deposited in the thickness of 3 μm on the (111) plane by a microwave plasma CVD method. A pattern 104 of Al as shown in FIG. 2 c) was formed on a surface of this deposited layer by photolithography. The thickness of Al was approximately 3-10 μm. Using this Al as a mask, reactive ion etching (hereinafter referred to as RIE) of diamond was conducted using $CF_4$-added oxygen gas. As a result, the diamond was etched to the depth of about 60-150 μm, thereby obtaining the shape as shown in FIG. 2 d).

Thereafter, the length of several millimeters from the tip was covered with a metal mask, and the diamond was etched by RIE in a $CF_4$-added oxygen atmosphere from the side where the P-doped epitaxial layer was not formed. On that occasion, etching by surface processing using laser processing was also used on an as-needed basis.

As a consequence of this processing, the front end region and the intermediate region were formed as shown in FIG. 2 e), and the thickness of the intermediate region was as listed in Table 1. At this time, the tip was sharpened as follows: the sharpness (radius of curvature) of the metal mask was increased to sub μm order on the occasion of RIE processing of diamond with the metal as a mask in the stage to FIG. 2 d), whereby the tip of diamond was maintained in degree of sharpness of the same order. Furthermore, the sharpness was somewhat deteriorated by the RIE from the back, but the radius of curvature of sub μm order was maintained. The radius of curvature of the tip in FIG. 2 e) was actually measured and was not more than approximately 1 μm as shown in Table 1.

Table 1 shows the cross-sectional area and the longitudinal length of the rear end region 201 intended for grasping, and the cross-sectional area and the longitudinal length of the intermediate region 202 in the electron emitting cathodes A-E obtained as described above.

Figure 3:
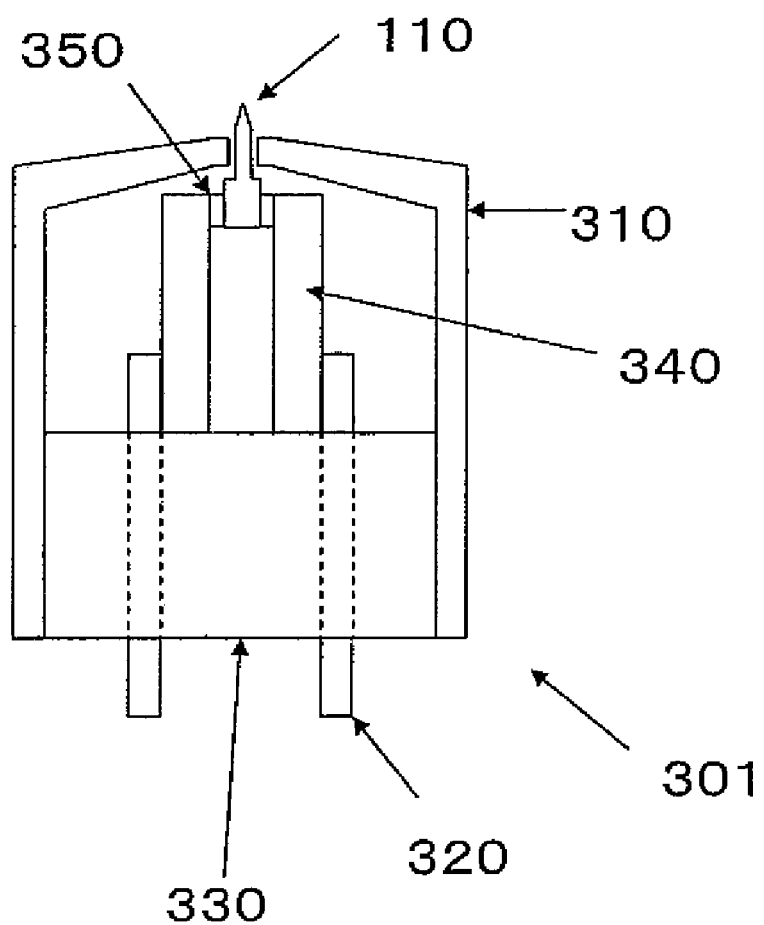
FIG. 3 is a conceptual diagram showing an electron gun according to the present invention.

Each of the electron emitting cathodes A-E obtained in this manner was incorporated in an electron gun 301 as shown in FIG. 3. Specifically, the diamond electron emitting cathode 110 was pinched by a metal member 340 of inconel and an electric current was supplied from terminals 320 of kovar. The terminals were held by an insulating ceramic 330. A suppressor (with a hole diameter of 0.6 mmφ at the tip) 310 of Mo was attached and the assembly was attached to an electron microscope (model ERA-8900FE available from ELIONIX Co., Ltd.). On this occasion, the thinned intermediate region 202 was set to penetrate through a hole of the suppressor 310. On the occasion of attaching the assembly to the electron gun part of the scanning electron microscope (hereinafter referred to as SEM), the tip of the chip and the extraction electrode were brought close to each other to the distance of about 0.3 mm.

An electric current was supplied through the kovar terminals 320 to the electron emitting cathode A-E to heat the chip. The emission current was evaluated with the extraction voltage of 5 kV and the acceleration voltage of 30 kV. Table 1 also presents evaluation of energy dispersion. Excellent performance was exhibited for SEM observation. Furthermore, each sample was attached to an electron beam lithography system (model JSM-7000F available from JEOL Ltd.) and it succeeded in drawing in the line width of not more than 100 nm.

Comparative Example 1

Electron emitting cathodes G-L listed in Table 1 were fabricated in the same manner as in Example 1.

The cathode G had the intermediate region in large width and the cross-sectional area of 0.225 $mm^2$. As a consequence, the cathode was unable to penetrate through the hole of the suppressor 310 and it was thus necessary to assemble the electron gun using the suppressor with a larger hole. The electron gun was used to be incorporated in an electron microscope and in an electron beam drawing apparatus as in Example 1, and a sufficient emission current was extracted, but convergence was poor, 1 μmφ or more, resulting in failure of high-resolution electron microscope observation and high-accuracy pattern drawing.

The cathodes H and I had the long lengths of the rear end region and the intermediate region, each 4 mm. This increased the size of the material, 5 mm or more long, and led to increase in cost.

The cathode J was a sample in which the common principal surface of the front end region, the intermediate region, and the rear end region had the plane orientation of (100). This resulted in failing to sufficiently lower the resistance of the n-type diamond layer formed on the principal surface, and when the electron gun fabricated with the cathode J was incorporated in the electron microscope and the emission current was measured in the same manner as in Example 1, the maximum emission current was not more than 10 μA and was insufficient for use in the electron microscope and the electron beam lithography system.

The cathode K had the intermediate region in the large thickness of 0.3 mm. This resulted in degrading the tip curvature radius of the sharpened tip to 12 μm. When the electron gun fabricated with this cathode was incorporated and the emission current was measured in the same manner as in Example 1, the emission current extracted was approximately 80 μA, but convergence was poor, 5 μm or more, which was insufficient for use in the electron microscope and the electron beam lithography system.

The cathode L had the intermediate region in the thickness of 0.01 mm, but the intermediate region broke in the middle of assembling an electron gun, resulting in failure in use as an electron gun.

The electron emitting cathode F was prepared as a sample using a ZrO/W electron gun (commercially available product) based on the conventional technology, instead of diamond. The emission current extracted was about 90 μA, but the temperature needed to be raised to about 1800° C. for emission of electrons in this amount, and as a consequence, the energy dispersion of a resultant electron beam was as large as 0.7 eV.

occasion, etching by surface processing using laser processing was also used on an as-needed basis.

Figure 5:
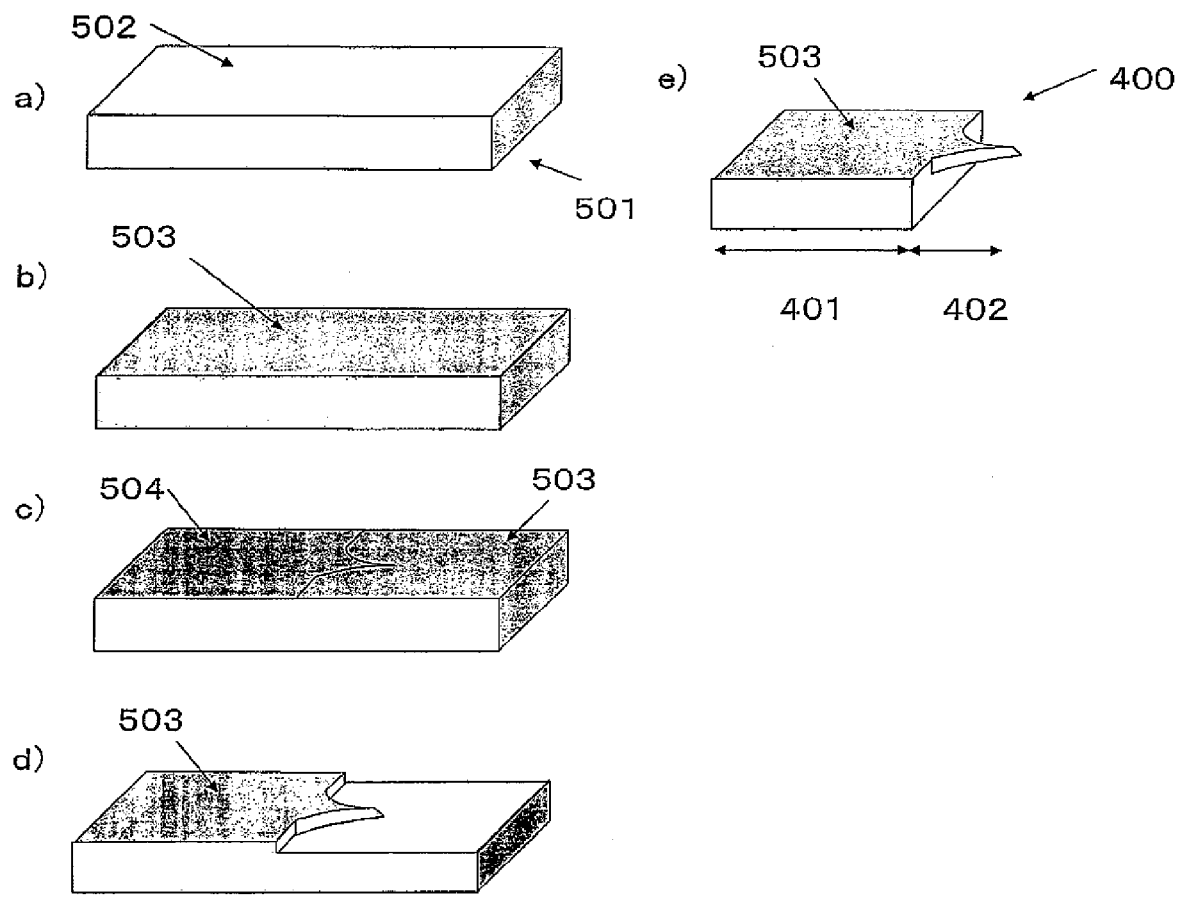
FIG. 5 is a perspective view showing a production process (second embodiment) of the electron emitting cathode according to the present invention.

As a consequence of this processing, the front end region was formed as shown in FIG. 5 e). At this time, the tip was

TABLE 1

|  |  | EXAMPLE 1 | | | | | COMPARATIVE EXAMPLE 1 | |
|---|---|---|---|---|---|---|---|---|
|  |  | A | B | C | D | E | F | G |
| DIAMOND MATERIAL | TYPE | Ib | IbB | IIa | IIb | CVDIb | ZrO/W | IbB |
|  | WIDTH [mm] | 1.5 | 2 | 0.6 | 2 | 2 | — | 2 |
|  | LENGTH [mm] | 3 | 3 | 2.5 | 3 | 3 | — | 3 |
|  | THICKNESS [mm] | 1 | 1 | 0.5 | 1 | 1 | — | 1 |
| SHARPENING OF FRONT END REGION | RADIUS OF CURVATURE OF TIP [μm] | 0.8 | 0.9 | 0.7 | 0.8 | 0.7 | — | 0.9 |
| SECTIONAL AREA OF REAR END REGION [mm$^2$] | | 1.5 | 2 | 0.3 | 2 | 2 | — | 2 |
| LENGTH OF REAR END REGION [mm] | | 1 | 2 | 1 | 2 | 1 | — | 1 |
| SECTIONAL AREA OF INTERMEDIATE REGION [mm$^2$] | | 0.045 | 0.06 | 0.036 | 0.06 | 0.045 | — | 0.225 |
| WIDTH OF INTERMEDIATE REGION [mm] | | 0.3 | 0.4 | 0.6 | 0.4 | 0.3 | — | 1.5 |
| THICKNESS OF INTERMEDIATE REGION [mm] | | 0.15 | 0.15 | 0.06 | 0.15 | 0.15 | — | 0.15 |
| LENGTH OF INTERMEDIATE REGION [mm] | | 1 | 0.5 | 1 | 0.5 | 1.5 | — | 1.5 |
| EVALUATION | | | | | | | | |
| OPERATING TEMPERATURE [° C.] | | 700 | 400 | 300 | 500 | 700 | 1800 | 400 |
| EMISSION CURRENT [μA] | | 110 | 150 | 100 | 130 | 140 | 90 | 140 |
| ENERGY DISPERSION [eV] | | 0.23 | 0.21 | 0.25 | 0.22 | 0.24 | 0.7 | |

|  |  | COMPARATIVE EXAMPLE 1 | | | | |
|---|---|---|---|---|---|---|
|  |  | H | I | J | K | L |
| DIAMOND MATERIAL | TYPE | IbB | IbB | Ib | IbB | IbB |
|  | WIDTH [mm] | 2 | 2 | 1.5 | 2 | 2 |
|  | LENGTH [mm] | 5 | 5 | 2.5 | 3 | 3 |
|  | THICKNESS [mm] | 1 | 1 | 1 | 1 | 1 |
| SHARPENING OF FRONT END REGION | RADIUS OF CURVATURE OF TIP [μm] | 0.9 | 0.8 | 0.7 | 12 | 0.7 |
| SECTIONAL AREA OF REAR END REGION [mm$^2$] | | 2 | 2 | 1.5 | 2 | 2 |
| LENGTH OF REAR END REGION [mm] | | 4 | 0.5 | 1 | 2 | 2 |
| SECTIONAL AREA OF INTERMEDIATE REGION [mm$^2$] | | 0.06 | 0.06 | 0.045 | 0.09 | 0.004 |
| WIDTH OF INTERMEDIATE REGION [mm] | | 0.4 | 0.4 | 0.3 | 0.3 | 0.4 |
| THICKNESS OF INTERMEDIATE REGION [mm] | | 0.15 | 0.15 | 0.15 | 0.3 | 0.01 |
| LENGTH OF INTERMEDIATE REGION [mm] | | 0.5 | 4 | 1 | 0.5 | 0.5 |
| EVALUATION | | | | | | |
| OPERATING TEMPERATURE [° C.] | | | | 500 | 400 | |
| EMISSION CURRENT [μA] | | | | 10 | 80 | |
| ENERGY DISPERSION [eV] | | | | | | |

Example 2

Single crystal diamonds M-P obtained by a high-temperature high-pressure synthesis method were prepared as shown in FIG. 5 a). Another single crystal diamond Q homoepitaxially grown similarly by a CVD growth technique was also prepared. Concerning the plain orientation, a surface denoted by 502 in the drawing was the (111) plane (with deviation of plain orientation of 3-5°). As shown in FIG. 5 b), a P-doped epitaxial diamond 503 was deposited in the thickness of 3 μm on the (111) plane by a microwave plasma CVD method. A pattern 504 of Al as shown in FIG. 5 c) was formed on a surface of this deposited layer by photolithography. The thickness of Al was approximately 3-10 μm. Using this Al as a mask, reactive ion etching (hereinafter referred to as RIE) of diamond was conducted using CF$_4$-added oxygen gas. As a result, the diamond was etched to the depth of about 60-150 μm, thereby obtaining the shape as shown in FIG. 5 d).

Thereafter, the length of several millimeters from the tip was covered with a metal mask, and the diamond was etched by RIE in a CF$_4$-added oxygen atmosphere from the side where the P-doped epitaxial layer was not formed. On that sharpened as follows: the sharpness (radius of curvature) of the metal mask was increased to sub μm to several μm order on the occasion of RIE processing of diamond with the metal as a mask in the stage to FIG. 5 d), whereby the tip of diamond was maintained in degree of sharpness of the same order. Furthermore, the sharpness was somewhat deteriorated by the RIE from the back, but the radius of curvature of sub μm order was maintained. The radius of curvature of the tip in FIG. 5 e) was actually measured and was not more than approximately 1 μm as shown in Table 2.

Table 2 presents the cross-sectional area and the longitudinal length of the rear end region 401 intended for grasping, in the electron emitting cathodes M-Q obtained in this manner.

Each of the electron emitting cathodes M-Q obtained in this manner was incorporated in an electron gun 301 as shown in FIG. 3. Specifically, the diamond electron emitting cathode 110 was pinched by a metal member 340 of inconel and an electric current was supplied from terminals 320 of kovar. The terminals were held by insulating ceramic 330. A suppressor (with a hole diameter of 0.6 mmφ at the tip) 310 of Mo was attached and the assembly was attached to an electron microscope (model ERA-8900FE available from ELIONIX Co., Ltd.). On this occasion, the front end region 402 was set to penetrate through a hole of the suppressor 310. On the occasion of attaching the assembly to the electron gun part of the scanning electron microscope (hereinafter referred to as SEM), the tip of the chip and the extraction electrode were brought close to each other to the distance of about 0.3 mm.

An electric current was supplied through the kovar terminals 320 to the electron emitting cathode M-Q to heat the chip. The emission current was evaluated with the extraction voltage of 5 kV and the acceleration voltage of 30 kV. Table 2 also presents evaluation of energy dispersion. Excellent performance was exhibited for SEM observation. Furthermore, each sample was attached to an electron beam lithography system (model JSM-7000F available from JEOL Ltd.) and it succeeded in drawing in the line width of not more than 100 nm.

Comparative Example 2

Electron emitting cathodes R and S listed in Table 2 were fabricated in the same manner as in Example 2.

The cathode R had the rear end region in the long length of 4 mm. This increased the size of the material, 5 mm or more long, and led to increase in cost.

The cathode S was a sample in which the common principal surface of the front end region and the rear end region had the plane orientation of (100). This resulted in failing to sufficiently lower the resistance of the n-type diamond layer formed on the principal surface, and when the electron gun fabricated with the cathode S was incorporated in the electron microscope and the emission current was measured in the same manner as in Example 2, the maximum emission current was not more than 10 μA and was insufficient for use in the electron microscope and the electron beam lithography system.

the common principal surface is arranged in the rear end region and the front end region and the electroconductive layer is formed on the principal surface, thereby achieving the improvement in the electron emission current.

The invention claimed is:

1. A columnar diamond electron emitting cathode having a single crystal diamond in at least a part thereof, said columnar diamond electron emitting cathode comprising:
   a front end region intended for electron emission,
   a rear end region intended for grasping, and
   a thinned intermediate region located between the front end region and the rear end region,
   wherein a tip part of the front end region is sharpened, and
   wherein the rear end region, the front end region, and the thinned intermediate region have a common principal surface, an electroconductive layer is formed on at least a part of the common principal surface, and the electroconductive layer ensures electrical conduction between the rear end region and the front end region.

2. The diamond electron emitting cathode according to claim 1, wherein a cross-sectional area of the rear end region is not less than 0.1 mm$^2$ and a cross-sectional area of the intermediate region is not more than 0.1 mm$^2$.

3. The diamond electron emitting cathode according to claim 1, wherein a longitudinal length of the rear end region is not less than 0.5 mm nor more than 2 mm and a longitudinal length of the intermediate region is not less than 0.5 mm nor more than 2 mm.

4. The diamond electron emitting cathode according to claim 1, wherein a plain orientation of the common principal surface is a (111) plane, or a plane with deviation of not more than 8° from the (111) plane.

5. The diamond electron emitting cathode according to claim 1, wherein the electroconductive layer is made of a diamond to demonstrate a n-type semiconductivity.

TABLE 2

| | | EXAMPLE 2 | | | | | COMPARATIVE EXAMPLE 2 | |
|---|---|---|---|---|---|---|---|---|
| | | M | N | O | P | Q | R | S |
| DIAMOND MATERIAL | TYPE | Ib | IbB | IIa | IIb | CVDIb | IbB | Ib |
| | WIDTH [mm] | 1.5 | 2 | 1 | 2 | 2 | 2 | 1.5 |
| | LENGTH [mm] | 3 | 3 | 3 | 3 | 3 | 5 | 2.5 |
| | THICKNESS [mm] | 1 | 1 | 0.5 | 1 | 1 | 1 | 1 |
| SHARPENING OF FRONT END REGION | RADIUS OF CURVATURE OF TIP [μm] | 0.8 | 0.9 | 0.7 | 0.8 | 0.9 | 0.8 | 0.9 |
| SECTIONAL AREA OF REAR END REGION [mm$^2$] | | 1.5 | 2 | 0.5 | 2 | 2 | 2 | 1.5 |
| LENGTH OF REAR END REGION [mm] | | 2 | 0.5 | 1 | 2 | 1 | 4 | 1 |
| LENGTH OF FRONT END REGION [mm] | | 1 | 2.5 | 2 | 1 | 2 | 1 | 1.5 |
| EVALUATION | | | | | | | | |
| OPERATING TEMPERATURE [° C.] | | 700 | 400 | 800 | 500 | 700 | | 500 |
| EMISSION CURRENT [μA] | | 120 | 130 | 100 | 140 | 140 | | 10 |
| ENERGY DISPERSION [eV] | | 0.24 | 0.21 | 0.25 | 0.22 | 0.22 | | |

The present invention enabled provision of the electron emitting cathode made of diamond, by forming the rear end of the columnar diamond electron emitting cathode as a stably graspable rear end region and sharpening the tip part of the front end region. Furthermore, the present invention employs diamond for the electron emitting cathode, whereby it achieves the effect of enabling extraction of electrons into vacuum with a weaker electric field and at lower temperature than the electron emitting cathode materials used before. The present invention achieves the stabler electron emission characteristic by employing single crystal diamond. Furthermore, 6. The diamond electron emitting cathode according to claim 1, wherein a cross-sectional shape of the rear end region is substantially rectangular or square.

7. The diamond electron emitting cathode according to claim 1, wherein a thickness of the thinned intermediate region is not less than 0.02 mm nor more than 0.15 mm.

8. A columnar diamond electron emitting cathode having a single crystal diamond in at least a part thereof, said columnar diamond electron emitting cathode comprising:
   a front end region intended for electron emission, and
   a rear end region intended for grasping, wherein a tip part of the front end region is sharpened, and
wherein the rear end region and the front end region have a common principal surface, an electroconductive layer is formed on at least a part of the common principal surface, and the electroconductive layer ensures electrical conduction between the rear end region and the front end region.

9. The diamond electron emitting cathode according to claim 8, wherein a cross-sectional area of the rear end region is not less than 0.1 mm$^2$, a longitudinal length of the rear end region is not less than 0.5 nor more than 2.0 mm, and a length of the front end region is not less than 1.0 nor more than 3.0 mm.

10. The diamond electron emitting cathode according to claim 8, wherein a plain orientation of the common principal surface is a (111) plane, or a plane with deviation of not more than 8° from the (111) plane.

11. The diamond electron emitting cathode according to claim 8, wherein the electroconductive layer is made of a diamond to demonstrate a n-type semiconductivity.

12. The diamond electron emitting cathode according to claim 8, wherein a cross-sectional shape of the rear end region is substantially rectangular or square.

13. A diamond electron source having a structure comprising at least the diamond electron emitting cathode as set forth in claim 1, an insulating ceramic, and at least one pair of terminals for supplying an electric current to the electron emitting cathode.

14. The diamond electron source according to claim 13, which has an electroconductive member for suppressing electron emission from a region except for the front end region of the diamond electron emitting cathode, wherein the intermediate region of the diamond electron emitting cathode penetrates through a through hole formed in the electroconductive member.

15. A diamond electron source having a structure comprising at least the diamond electron emitting cathode as set forth in claim 8, an insulating ceramic, and at least one pair of terminals for supplying an electric current to the electron emitting cathode.

16. The diamond electron source according to claim 15, which has an electroconductive member for suppressing electron emission from a region except for the front end region of the diamond electron emitting cathode, wherein the front end region of the diamond electron emitting cathode penetrates through a through hole formed in the electroconductive member.

17. An electron microscope wherein the diamond electron source as set forth in claim 13 is mounted.

18. An electron beam lithography system wherein the diamond electron source as set forth in claim 13 is mounted.

* * * * *